(12) United States Patent
Sanchez et al.

(10) Patent No.: US 7,101,736 B2
(45) Date of Patent: Sep. 5, 2006

(54) METHOD OF ASSEMBLING A SEMICONDUCTOR COMPONENT AND APPARATUS THEREFOR

(75) Inventors: Audel A. Sanchez, Tempe, AZ (US); Taek K. Kim, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/891,648

(22) Filed: Jul. 15, 2004

(65) Prior Publication Data

US 2006/0014325 A1    Jan. 19, 2006

(51) Int. Cl.
*H01L 21/44* (2006.01)
*H01L 21/48* (2006.01)
*H01L 21/50* (2006.01)

(52) U.S. Cl. ............... 438/123; 438/108; 438/613

(58) Field of Classification Search ........... 438/12–14, 438/123, 108, 109, 118, 116, 613, 612; 257/732
See application file for complete search history.

(56) References Cited

U.S. PATENT DOCUMENTS

| | | | |
|---|---|---|---|
| 5,509,464 A * | 4/1996 | Turner et al. ............... | 165/80.2 |
| 5,535,515 A * | 7/1996 | Jacoby ..................... | 29/890.03 |
| 5,854,085 A * | 12/1998 | Raab et al. ................. | 438/123 |
| 5,877,555 A * | 3/1999 | Leighton et al. ............ | 257/732 |
| 6,165,817 A * | 12/2000 | Akram et al. ............... | 438/118 |
| 6,204,090 B1 * | 3/2001 | Boyle et al. ................ | 438/108 |
| 6,261,868 B1 * | 7/2001 | Miller et al. ................ | 438/123 |
| 6,351,032 B1 * | 2/2002 | Lee et al. ................... | 257/706 |
| 6,462,413 B1 | 10/2002 | Polese et al. | |
| 6,534,859 B1 * | 3/2003 | Shim et al. ................. | 257/706 |
| 6,741,470 B1 * | 5/2004 | Isenburg ..................... | 361/704 |
| 6,819,003 B1 * | 11/2004 | Farnworth .................. | 257/787 |

* cited by examiner

*Primary Examiner*—Walter L. Lindsay, Jr.
(74) *Attorney, Agent, or Firm*—Kim-Marie Vo

(57) ABSTRACT

A method of assembling a semiconductor component includes providing a pedestal, placing a first piece on the curved pedestal, wherein the first piece comprises a semiconductor die, placing a second piece over the first piece, and providing an adhesive between the first piece and the second piece. The method further includes applying pressure with a first plate to the first piece and second piece to snap the first piece with the second piece, and applying heat with a second plate to reflow the adhesive, wherein applying heat is performed simultaneously with applying pressure.

12 Claims, 5 Drawing Sheets

METHOD OF ASSEMBLING A SEMICONDUCTOR COMPONENT AND APPARATUS THEREFOR

FIELD OF THE INVENTION

This invention relates generally to forming semiconductor components, and more specifically, to assembling portions of a semiconductor component together.

BACKGROUND

To package a semiconductor die, the semiconductor die is coupled to a header. The header is formed by assembling at least the following: 1) a window frame with leads, and 2) a flange to support the semiconductor dies. A solder is connects the window frame to the flange. To form the header, an operator manually aligns the parts together and then puts them on a flat conveyor belt through a furnace, which usually takes approximately fifty minutes. The furnace heats the solder to attach the window frame to the flange. In addition, pressure may be applied to enable the attaching.

By using the furnace process, the resulting header undesirably flat resulting in poor heat dissipation. Sometimes the window frame is cracked due to mechanical stress on package from the pressure applied during the furnace process. The cracking can create a defective sealing on the subsequently formed package. In addition, the process is time consuming. Therefore, a need exists for a process for forming a header that decreases cycle time, results in a header with improved heat dissipation, and decreases window frame cracking.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 2:
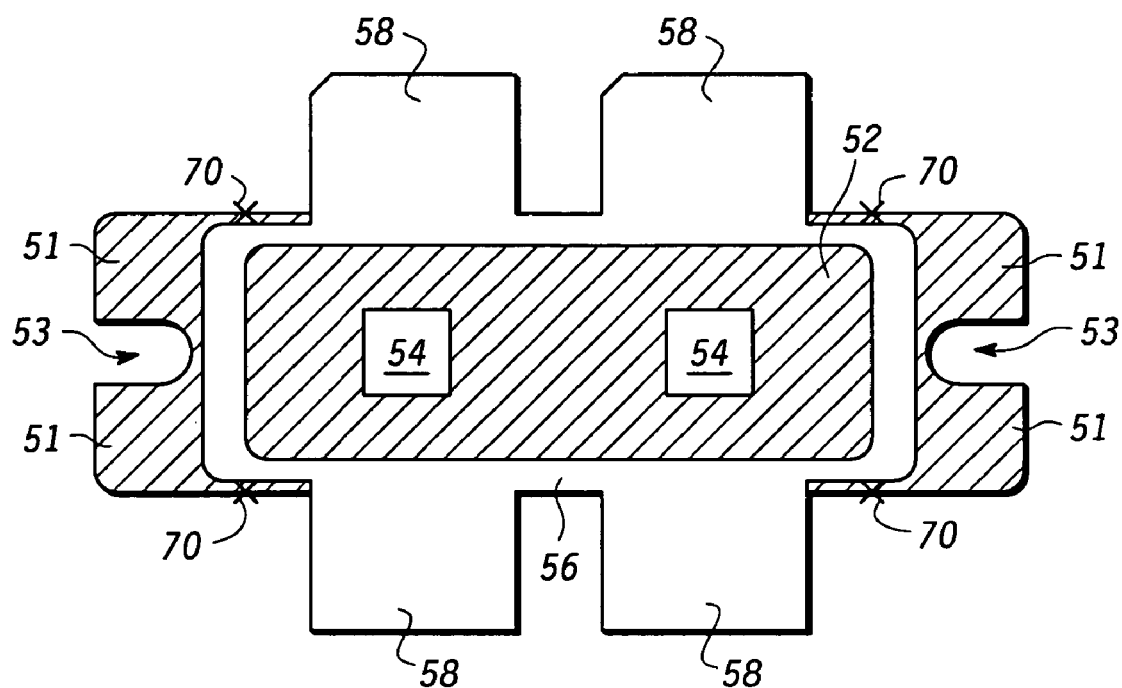
FIG. 2 illustrates a top-down view of a semiconductor component in accordance with an embodiment of the present invention.
Figure 3:
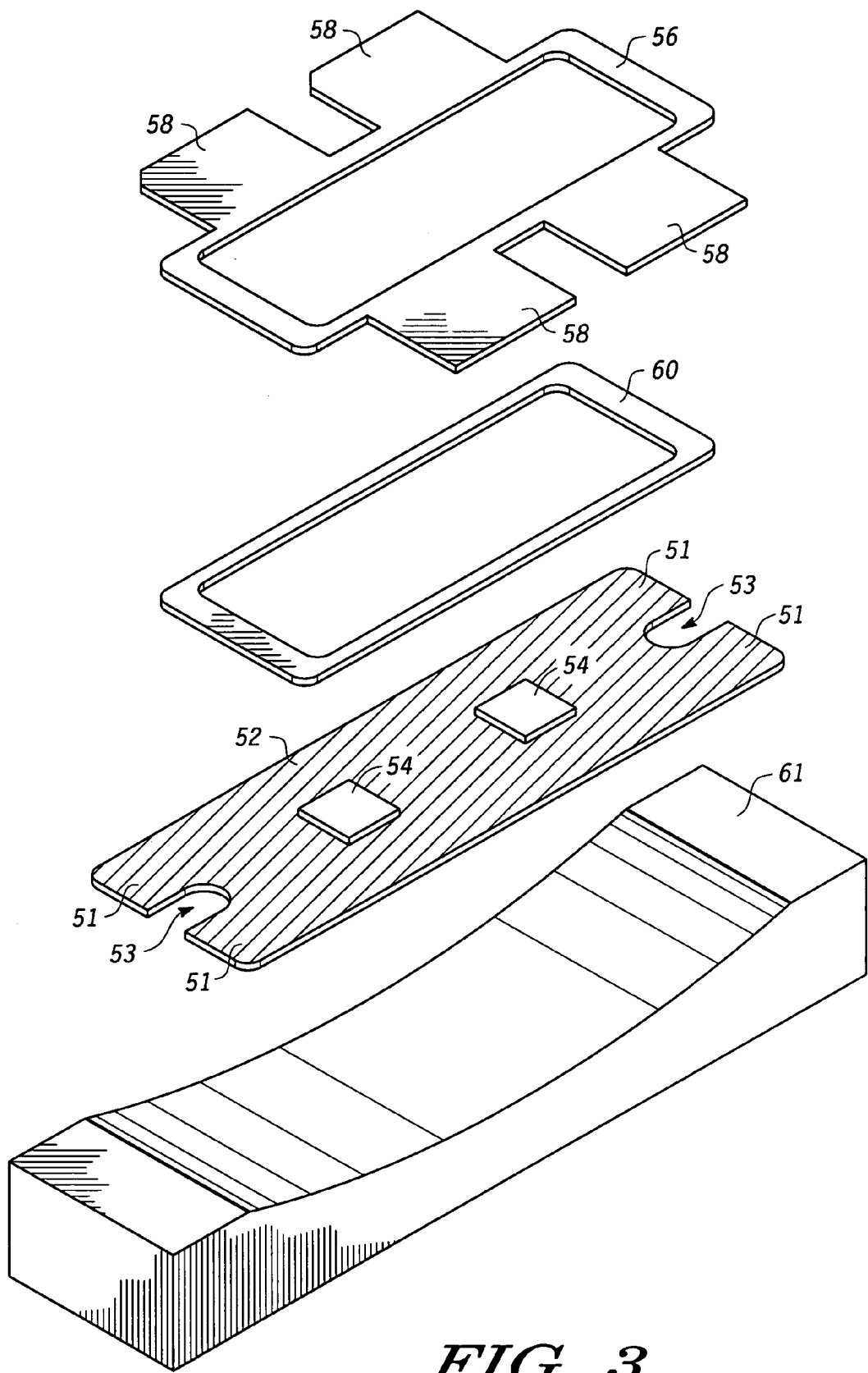
FIG. 3 illustrates aligned portions of the semiconductor component of FIG. 2 before assembly and a pedestal upon which the portions are placed for assembly in accordance with an embodiment of the present invention.
Figure 4:
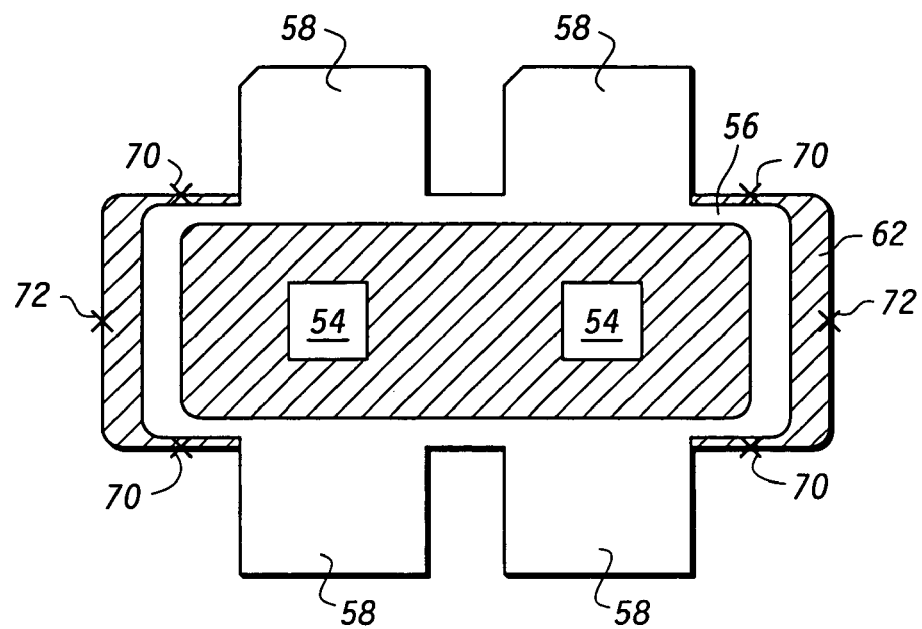
FIG. 4 illustrates a top-down view of another semiconductor component in accordance with an embodiment of the present invention.

The tool 10 may be used to assembly pieces of a semiconductor part or component. In one embodiment, the pieces include an insulating material, which is one embodiment is a window frame, and a flange. The window frame may include leads or an additional piece with leads may be used. As shown in FIGS. 2–4, the flange 52 supports semiconductor dies 54 and the window frame 56 with leads 58, in one embodiment, is coupled to the flange via solder 60. (Any number of semiconductor die, such as zero, one, two, three, etc., may be present on the flange 52. Two semiconductor dies 54 are shown in the figures for illustration purposes.) The leads 58 during later processing are electrically coupled to the semiconductor dies 54, in one embodiment, by wirebonding. Each semiconductor die 54 is coupled to two of the leads 58 (a set of leads that are on opposite sides of the window frame 56 from each other). The combination of the flange 52, the window frame 56, and the leads 58 form the header, which is used as the base or mounting plate during subsequent processing to package the semiconductor dies 54. The flange 52, as shown in FIGS. 2 and 3, may include a feature such as a notch 53, which may be desired to held couple the flange and the subsequently formed header to panels or mating connectors during subsequent processing. In addition, the flange 52 dissipates heat during subsequent processing. Similarly, the window frame 56 may also serve to couple the header to panels or mating connectors during subsequent processing. An understanding of the tool 10 and the semiconductor components that can be used in conjunction with the tool 10 will be better understood after turning to the figures.

Figure 1:
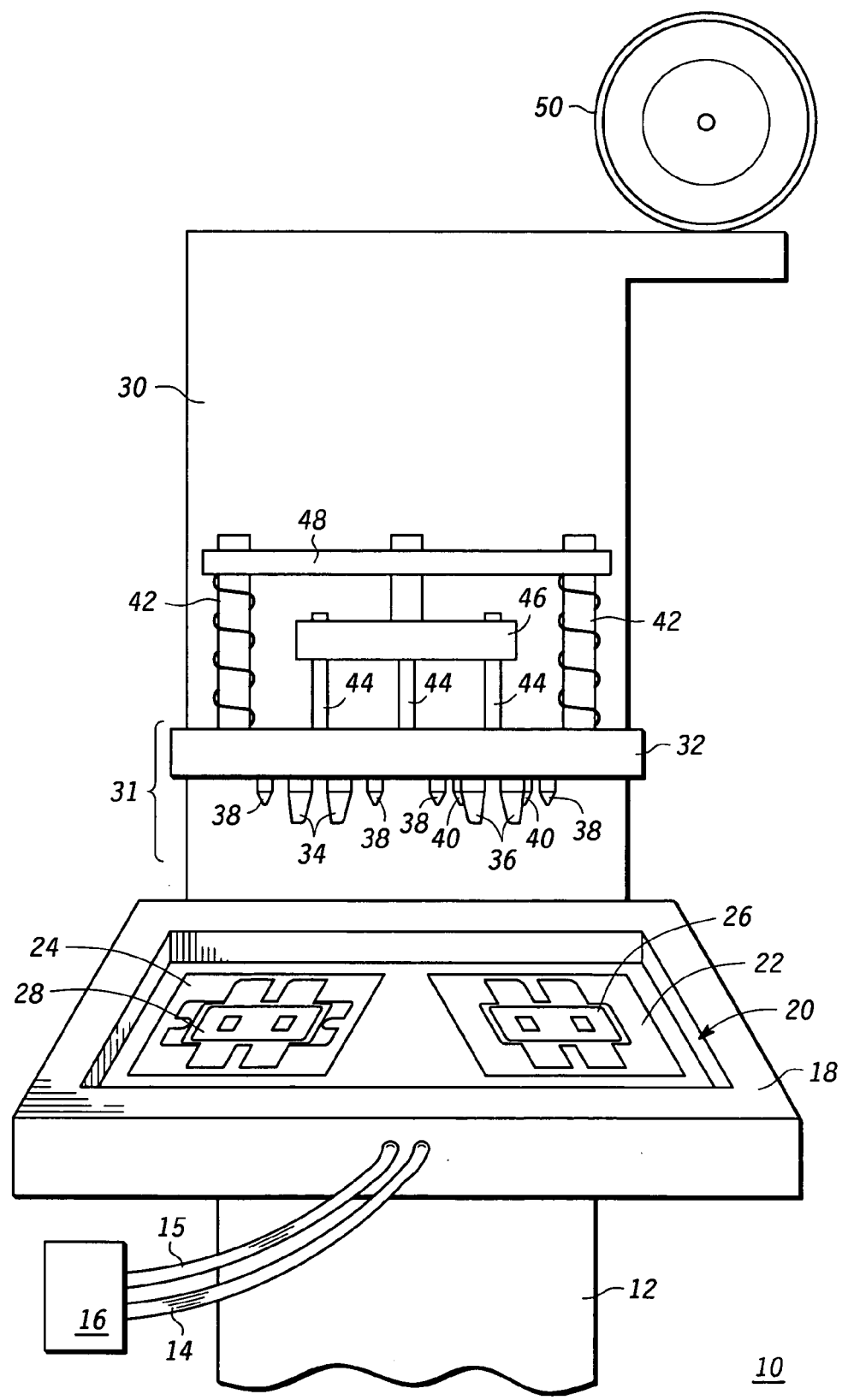
FIG. 1 illustrates a tool used to assemble pieces of a semiconductor component in accordance with an embodiment of the present invention.

A tool 10 in FIG. 1 may be used to form the header by assembling the window frame 56, the solder 60, the flange 52, and the leads 58, if they are part of a piece separate from the window frame 56. The tool 10 snaps the pieces together by applying pressure and melts the solder 60 by applying heat. Thus, the tool 10 simultaneously snaps and reflow the solder to form the header with the semiconductor dies 54. In one embodiment, the pressure is applied to the top of the stack with the window frame 56 on top and heat is applied to the bottom of the stack with the flange 52 on the bottom.

Supporting the entire tool 10 and coupling the frame 18 to the alignment system 31 and other portions of the tool 10 is the pedestal 12, which can be made of any suitable material, such as a metal or a plastic. In one embodiment, the pedestal rest on a floor.

Although the tool as shown in FIG. 1 is set up to assembly two semiconductor components, the tool 10 can be modified to assembly only one or more than two semiconductor components. The semiconductor part sits on a pedestal and becomes a header by using the tool 10 to assemble the various pieces. In FIG. 1, element 26 includes a first part with semiconductor dies and a first pedestal (first part and pedestal) and element 28 includes a second part with semiconductor dies and a second pedestal (second part and pedestal). The parts and pedestals 26 and 28 are within cavities 24 and 26, which are formed within a heat plate 20. The first part and pedestal 26 is within the first cavity 24 and the second part and pedestal 28 is within the cavity 26. In one embodiment, the top of the part and pedestal is coplanar with the top of the cavity and the heat plate 20. The heat plate 20 can be any conductive material, such as a metal (e.g., aluminum), or can be a ceramic heater element. The heat plate 20 sits within a frame 18 to provide support. Underneath the heat plate 20 (and not visible in FIG. 1) is a heater that is used during assembly.

Gas flows into the frame 18 to provide gas to the tool 10 during assembly. An inlet gas tube 14 and an outlet gas tube 15 are coupled to a gas source 16 and the tool 10 via the frame 18. However, a skilled artisan should recognize that the gas can be provided to and removed from the tool 10 in other ways. In one embodiment, the gas supplied is a noble or forming gas, such as $N_2H_2$ or Ar. The gas is used to create an inert atmosphere around the parts and eliminate any presence or oxygen that could create solder oxidation . . .

The alignment system 31 includes an alignment header or plate 32 with alignment features 34, 36, 38 and 40. The alignment features 34 and 36 contact the flange 52 and locations 70 in FIG. 2. The alignment features 38 contact the flange 52 at location 72 if the flange does not have mounting features as in FIG. 4. If the flange has mounting features 51, then alignment features 40 will contact a notch 53 between the mounting features 51, as shown in FIG. 2. If the semiconductor part has mounting features 51 then the presence of the alignment features 38 will not affect the assembly and hence, the alignment features 38 need not be removed. However, if the part does not have mounting features 51, then the alignment features 40 should be removed so that they do not intersect the part undesirably. The alignment features 40 can be removed manually or by machine. For example, they can be unscrewed from the plate 32 by hand.

The alignment features 34 and 36 are shown to be larger than the alignment features 38, which are drawn larger than the alignment features 40; however, this is not necessary. Any size can be used with a few limitations. First, the alignment features 40 should have dimensions that are smaller than the dimensions of the notch 53 to enable them to fit within the notch 53 and not damage the mounting features 51. Secondly, the alignment features 34 and 36 should not have a dimension that will damage the leads 58. Thirdly, the size of all of the alignment features must be such that they can be formed in their desired location on the plate 32 with the other alignment features. In other words, the dimensions must not be such as to take up space of other alignment features that are present.

The alignment plate 32 not only is used to align the features but also applies pressure to form the headers. As described above, the alignment features all contact a portion of the perimeter of the headers. Since the parts lie within cavities the alignment plate 32 can move down until it is in contact with the parts and the alignment features can protrude into the cavities. Force is applied to the alignment plate 32 via the clamping mechanisms 44 that are coupled to the clamping plate 46. The clamping plate 46 will move down onto the alignment plate 32 via motors (not shown) within the pedestal 12 and the clamping mechanisms 44, which may be metal rods with wires or springs outside the rods. The force from the clamping plate 46 is distributed to the parts via the alignment plate 32. A pressure measurer 50, such as a dial indicator, strain gage, pressure sensor, or computer determines the amount of force being applied and, preferably, displays it to the user of the tool 10.

Illustrated in FIG. 2 is one embodiment of the part 28 that can be assembled using the tool 10 in FIG. 1. The part 28 includes the flange 52 with mounting features 51, window frame 56 with leads 58 formed over the flange 52, and semiconductor die 54 on the flange 52. In the embodiment, shown in FIG. 2. two semiconductor dies 54 are formed on the body portion of the flange 52 (i.e., any portion of the flange other than the mounting features 51). The semiconductor dies 54 have already undergone front-end processing as part of a wafer in a clean room environment to form transistors, other devices, interconnects, etc. The semiconductor die have been singulated from the wafer to form die. It is immaterial as to the processes used to form the semiconductor dies 54 as any processes can be used. The semiconductor dies 54 have been bonded, for example using a solder, epoxy or tape, to the flange 52.

The flange 52 may be any suitable material, such as copper or a copper alloy. As shown in FIG. 2, the flange 52 has mounting features 51 that are located on the shorter sides of the flange 52. The mounting features 51 are separated from each other by notch 53, which can be any shape, such as a portion of a circle as shown in FIG. 2. The window frame 56 is any insulating material, such as polytetrafluoroethylene (PTFE) or $Al_2O_3$ and may or may not include leads 58. The leads 58 may be made of conductive material, such as copper or a copper alloy. If the window frame 56 does not include leads 58 then another piece will be present that includes the leads. It may be desirable to purchase a window frame 56 and a separate piece with leads as it might be more cost effective than buying a fabricated window frame 56 with leads 58. When assembled the leads 58 expand past the long sides of the flange 51. The shorter sides of the window frame 56 do not overlap the notches 53 and instead all of the window frame, except for the majority of the leads 58, is directly over the flange 51. Furthermore, the window frame 56 has a hole in its center to expose the semiconductor dies 54 and portions of the flange 52. In addition, the mounting features 51 of the flange 52 are exposed and when the window frame 56 is present.

Illustrated in FIG. 3 is a view of the separate pieces of the part 28 aligned to how they would be if placed upon each other to assist in the reader's understanding. In other words, the pieces are spaced apart from each other as a teaching aid. The flange 52 with the semiconductor dies 54 already attached is placed on a pedestal 61. In one embodiment, the pedestal 61 is curved. The desired curvature of the pedestal 61 will depend on the part 28 being formed. In one embodiment, a pedestal with a range of curvature from approximately 10 mils concave to approximately 10 mils convex is used. As shown in FIG. 3, it is desirable for a curved pedestal wherein the curved portion is concave and in contact with the flange 52. By having a concave curved pedestal, the curvature of the part being formed can be controlled. In one embodiment, the header has a range of curvature from approximately 10 mils concave to approximately 10 mils convex. By having a curve and not being completely flat, the header will be able to dissipate more heat, reduce mechanical stress on the package, and eliminate window frame cracking, which can create defects in the sealing formed on packages.

Figure 6:
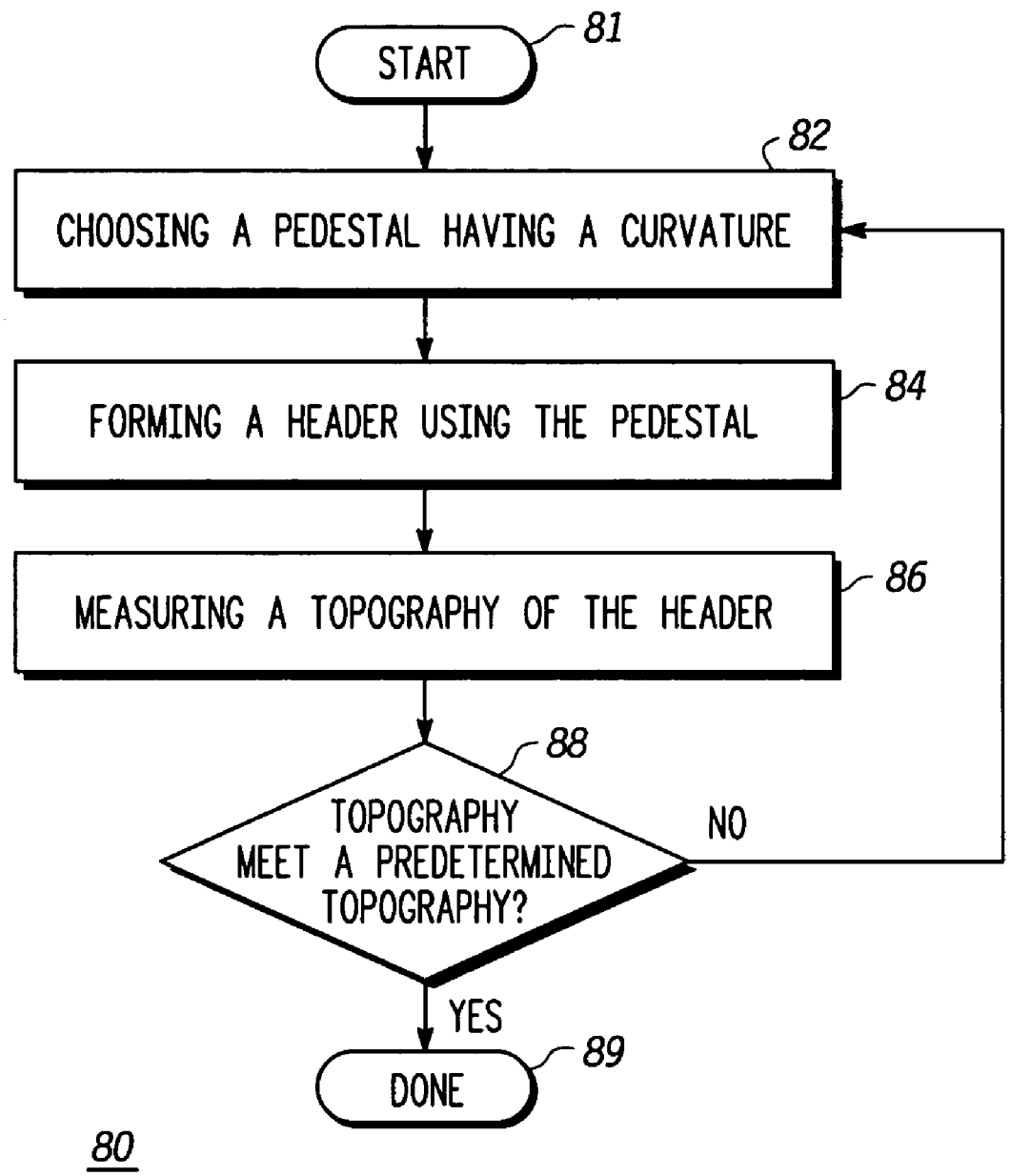
FIG. 6 illustrates a flow diagram for choosing a pedestal in accordance with an embodiment of the present invention.

The desired curvature of the pedestal 61 will depend on the semiconductor component being formed. FIG. 6 illustrates a flow diagram 80, which I one embodiment for determining the appropriate pedestal to use. First, the flow 80 is started 81 and a pedestal having a curvature is chosen 82. The curvature could be zero so that the pedestal is not curved at all. Next, a header is formed 84 using the pedestal. The topography of the header is measured 86 and compared 88 to a predetermined topography. The predetermined topography may be determined by heat dissipation evaluations and finite modeling or customer specifications. If the topographies match (within a predetermined tolerance) then the flow is done 89. But if the topography of the header is not sufficiently close enough to the predetermined topography then a new pedestal is chosen, a new header is formed and the topography of the new header is measured and compared to the predetermined topography. In other words, if the header's topography is not as desired then the process 82, 84, 86 and 88 are repeated.

Over the flange 52 is placed a solder 60. In one embodiment, the solder 60 is a perform solder that is used at low temperatures, such as approximately 280 to approximately 350 degrees Celsius. In another embodiment, the solder 60 is a braze that is at higher temperatures, up to approximately 850 degrees Celsius. The solder 60 may be any suitable material, such as a tin-lead composition or a lead-free material (e.g., a tin-silver composition). Placed over the solder 60 is an insulating material 56. In one embodiment, the insulating material 56 is a ceramic or organic material with metallization on top and bottom surfaces. The metallization can be any solderable material, such as Ni. In one embodiment, the insulating material 56 is termed a window frame. The window frame shown in FIG. 3 has leads 58. During subsequent wirebond processing, the leads 58 are electrically coupled to the semiconductor dies 54 via wirebonds. If the window frame does not include leads 58 then an additional piece may include leads 58. In this embodiment, the piece with the leads will be places over the window frame with solder between them. The piece with the leads will be coupled to the window frame simultaneously with the coupling of the window frame to the flange 52, in one embodiment, using the tool 10 in FIG. 1.

Figure 5:
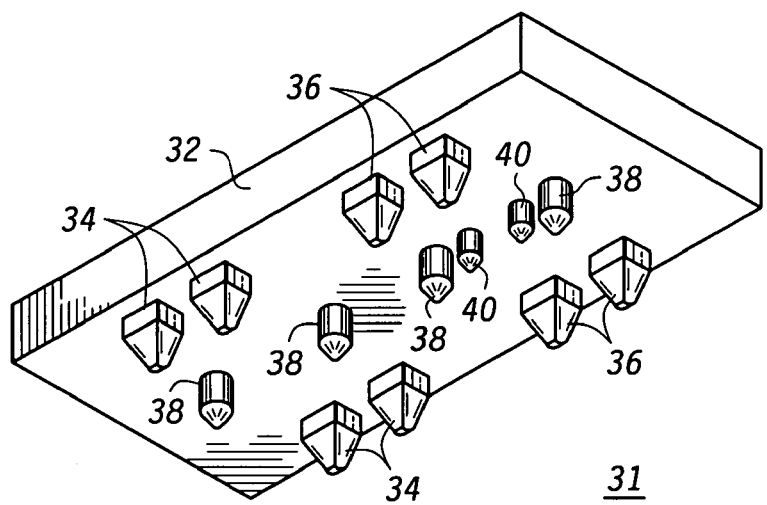
FIG. 5 illustrates a bottom view of an alignment system of that can be used with the tool of FIG. 1 in accordance with an embodiment of the present invention.

FIG. 4 illustrates an alternative semiconductor component 26. The semiconductor component 26 does not include mounting features 51 like the semiconductor component 28 in FIG. 2. Due to the lack of mounting features 51, the alignment features 38 in FIG. 5 as opposed to alignment features 40 are used. As shown in FIG. 5, in one embodiment, the alignment features 38 are further away from each other than the alignment features 40 because the length of the semiconductor component 26 is longer than the distance between the notches 53 of the semiconductor component 28 in FIG. 5. But the length of the semiconductor component 26 can be any dimension, even a length shorter than the distance between the notches 53 of the semiconductor component 28 in FIG. 5. As shown in FIG. 4, the alignment notches 38 contact the location 72 along the perimeter of the semiconductor component 26. In FIG. 4, the alignment notches 38 contact the shorter side of the flange 51. Any other configuration of the semiconductor component other than that shown in FIGS. 2 and 4 can be used.

FIG. 5 illustrates one configuration of alignment features 34, 36, 38 and 40 on the alignment plate 32; other configurations may be used. As previously discussed, certain alignment features align with certain portion of the parts. The configuration 100 to the left in FIG. 5 is most suitable for the part 26 shown in FIG. 4 since only the alignment features 34 and 38 are present. The configuration 110 to the right in FIG. 5 is most suitable for the part 28 of FIG. 2 since the configuration has alignment features 40 that can be aligned with the notch 53 of the part 28. Thus, if the configuration 110 to the right on the alignment plate 32 is used with the part 28 of FIG. 2 the alignment features 38 will not be used, only alignment features 40 and 36 will be used. The design of the alignment features allows for alignment and application of pressure on selective points on the parts to achieve pressure where required.

By now it should be appreciated that there has been provided a tool for mechanically coupling and chemically coupling, via heating of a solder, pieces to form a header to enable subsequent packaging processing of semiconductor dies. This results in more reliable parts than those formed by using conventional furnaces. In addition, cycle time is improved. It has been shown that cycle time can be reduced from approximately 50 minutes to approximately 2 minutes when using the tool 10 instead of the conventional furnace processes with graphite fixtures. Furthermore, the use of the tool 10 reduces the number of operators necessary to run the process (only one needed for the tool 10, whereas four may be used to run a furnace); reduces the square footage needed for the equipment to form the header (a furnace, which can be approximately 400 square feet in size, compared to the tool 10, which may be approximately 100 square feet in size if equipped for forming two pieces as shown in FIG. 1); decreases the amount of gases need (approximately 10 SCFH gases compared with approximately 620 SCFH gases used with a furnace); and decreases the amount of electricity needed (approximately 0.5 KW for the tool 10 and approximately 15 KW for a furnace). These reductions result in a decreased manufacturing cost.

The improved cycle time can be at least partially attributed to the fact that when using a furnace the time it takes much longer to reach the peak and reflow temperatures for solder than it does using the tool 10. In one embodiment, it may take a furnace approximately 30 minutes to reach the reflow zone, when the peak temperature is about 330 degrees Celsius, the reflow temperature is approximately 280 degrees Celsius, and the clamp pressure is approximately 8 pounds.

In the foregoing specification, the invention has been described with reference to specific embodiments. However, one of ordinary skill in the art appreciates that various modifications and changes can be made without departing from the scope of the present invention as set forth in the claims below. The method and apparatus discussed can be used to form any type of package. For example, the method and apparatus can be used to form an air cavity package where the die is attached to a heat sink and then a high temperature braze is performed to attach the ceramic ring and leads to the heat sink. Accordingly, the specification and figures are to be regarded in an illustrative rather than a restrictive sense, and all such modifications are intended to be included within the scope of the present invention. It may be desirable to configure the tool 10 so that the tool 10 can run automatically, elimination the material handling.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term another, as used herein, is defined as at least a second or more. The term "coupled", as used herein, is defined as connected, although not necessarily directly, and not necessarily mechanically.

What is claimed is:

1. A method of assembling a semiconductor component, the method comprising:
   providing a curved pedestal, wherein the curved pedestal has a concave portion;
   placing a first piece on the concave portion of the curved pedestal, wherein the first piece comprises a semiconductor die;
   placing a second piece over the first piece;
   providing an adhesive between the first piece and the second piece;
   applying pressure with a first plate to the first piece and second piece to snap the first piece with the second piece; and
   applying heat with a second plate to reflow the adhesive, wherein applying heat is performed simultaneously with applying pressure.

2. The method of claim 1, further comprising:
   aligning the first piece to the second piece with alignment features, wherein the alignment features are part of the plate.

3. The method of claim 1, further comprising:
   aligning the first piece to the second piece with alignment features, wherein the alignment features are part of the first piece.

4. The method of claim 1, wherein providing a curved pedestal comprises:
   providing a first curved pedestal;
   placing a first piece on the curved pedestal, wherein the first piece comprises a first semiconductor die;
   placing a second piece over the first piece;
   providing an adhesive between the first piece and the second piece;
   applying pressure with a first plate to the first piece and second piece to snap the first piece with the second piece; and
   applying heat with a second plate to reflow the adhesive and form a test semiconductor component, wherein applying heat is performed simultaneously with applying pressure;
   measuring the topography of the test semiconductor component,
   comparing the topography of the test semiconductor component to a predetermined topography; and
   choosing a second curved pedestal, wherein the second curved pedestal has a different curvature than the first curved pedestal; and
   providing the second curved pedestal.

5. The method of claim 4, wherein
   placing a first piece on the curved pedestal further comprises placing a first piece, wherein the first piece further comprises a flange;
   placing a second piece over the first piece further comprises placing a second piece, wherein the second piece comprises an insulator;
   providing an adhesive further comprises providing an adhesive, wherein the adhesive further comprises a solder perform.

6. The method of claim 1, wherein placing a second piece over the first piece further comprises placing a second piece, wherein the second piece further comprises leads.

7. The method of claim 1, wherein
   applying pressure with a first plate further comprises applying pressure from the top of the second piece; and
   applying heat with a second plate further comprises applying heat from the bottom of the first piece.

8. The method of claim 1, further comprising placing a third piece over the first piece, wherein the third piece comprises leads.

9. A method of forming a semiconductor component, the method comprising:
   providing a heat plate with a cavity;
   placing a curved pedestal in the cavity;
   placing a flange comprising a semiconductor die on the curved pedestal;
   placing solder on the flange;
   placing a window frame over the solder;
   moving an alignment header down and in contact with the window frame and the flange,
      wherein the alignment header comprises alignment features that secure alignment of the flange to the window frame;
   applying pressure with the alignment header to the first window frame and the flange;
   applying heat with the heat plate to reflow the solder to couple the flange, solder and window frame.

10. The method of claim 9, wherein placing the window frame over the solder comprises placing the window frame, wherein the window frame comprises leads.

11. The method of claim 9, wherein
    applying pressure further comprises applying pressure from the top of the window frame; and
    applying heat further comprises applying heat from the bottom of the flange.

12. The method of claim 9, wherein providing a curved pedestal comprises:
    providing a first curved pedestal;
    placing a first piece on the curved pedestal, wherein the first piece comprises a first semiconductor die;
    placing a second piece over the first piece;
    providing an adhesive between the first piece and the second piece;
    applying pressure with a first plate to the first piece and second piece to snap the first piece with the second piece; and
    applying heat with a second plate to reflow the adhesive and form a test semiconductor component, wherein applying heat is performed simultaneously with applying pressure;
    measuring the topography of the test semiconductor component;
    comparing the topography of the test semiconductor component to a predetermined topography; and
    choosing a second curved pedestal, wherein the second curved pedestal has a different curvature than the first curved pedestal; and
    providing the second curved pedestal.

* * * * *